United States Patent
Maffeis

(10) Patent No.: US 10,075,191 B2
(45) Date of Patent: Sep. 11, 2018

(54) METHOD FOR DECODING BITS-BY VARYING LLR VALUES IN A SOLID-STATE DRIVE, AND SOLID-STATE DRIVE IMPLEMENTING THE METHOD

(71) Applicant: NandEXT S.r.l., Località Dogana (SM)

(72) Inventor: Margherita Maffeis, Dalmine (IT)

(73) Assignee: NandEXT Srl, Localita Dogana (SM)

( * ) Notice: Subject to any disclaimer, the term of this patent is extended or adjusted under 35 U.S.C. 154(b) by 18 days.

(21) Appl. No.: 15/076,401

(22) Filed: Mar. 21, 2016

(65) Prior Publication Data
US 2017/0269993 A1    Sep. 21, 2017

(51) Int. Cl.
| | |
|---|---|
| *G11C 13/00* | (2006.01) |
| *H03M 13/37* | (2006.01) |
| *G11C 29/52* | (2006.01) |
| *H03M 13/11* | (2006.01) |
| *G06F 11/10* | (2006.01) |
| *H03M 13/45* | (2006.01) |
| *H03M 13/00* | (2006.01) |
| *G11C 29/04* | (2006.01) |

(52) U.S. Cl.
CPC ..... *H03M 13/3746* (2013.01); *G06F 11/1012* (2013.01); *G11C 29/52* (2013.01); *H03M 13/1111* (2013.01); *H03M 13/3723* (2013.01); *H03M 13/458* (2013.01); *H03M 13/6325* (2013.01); *G11C 2029/0409* (2013.01)

(58) Field of Classification Search
None
See application file for complete search history.

(56) References Cited

U.S. PATENT DOCUMENTS

| | | | | |
|---|---|---|---|---|
| 8,443,271 B1 * | 5/2013 | Zhang | ............... | H03M 13/1108 714/794 |
| 8,689,074 B1 * | 4/2014 | Tai | ............... | H03M 13/112 714/24 |
| 8,782,486 B2 * | 7/2014 | Zhang | ............... | G11B 20/1833 714/758 |
| 8,929,009 B2 * | 1/2015 | Yang | ............... | H03M 13/1111 360/39 |
| 9,059,742 B1 * | 6/2015 | Anderson | ............... | G06F 11/1068 |
| 9,378,765 B2 * | 6/2016 | Cai | ............... | G11B 20/1833 |
| 2010/0192043 A1 * | 7/2010 | Alrod | ............... | H03M 13/1111 714/763 |

(Continued)

*Primary Examiner* — Daniel McMahon
(74) *Attorney, Agent, or Firm* — Janeway Patent Law PLLC

(57) ABSTRACT

The invention relates to a method for decoding read bits including information bits from memory cells of a solid-state drive. The method comprises providing an indication of reliability of the read bits, and, based on the indication of reliability, iteratively soft decoding the read bits in order to obtain the information bits, wherein the soft decoding comprises, at each iteration of the soft decoding, if the current number of iterations has reached a predetermined number of iterations indicative of an admitted latency of the solid state drive, and if no information bits having an error rate below a predetermined error rate have been obtained, providing a further indication of reliability of the read bits, and iteratively soft decoding the read bits based on the further indication of reliability. The invention also relates to a corresponding controller and a corresponding solid-state drive.

30 Claims, 9 Drawing Sheets

(56) References Cited

U.S. PATENT DOCUMENTS

2011/0087946 A1* 4/2011 Planjery ............. H03M 13/1117
714/752
2011/0320902 A1* 12/2011 Gunnam ............ H03M 13/1128
714/752
2013/0179754 A1* 7/2013 Cherubini ........... G06F 11/1048
714/773

* cited by examiner

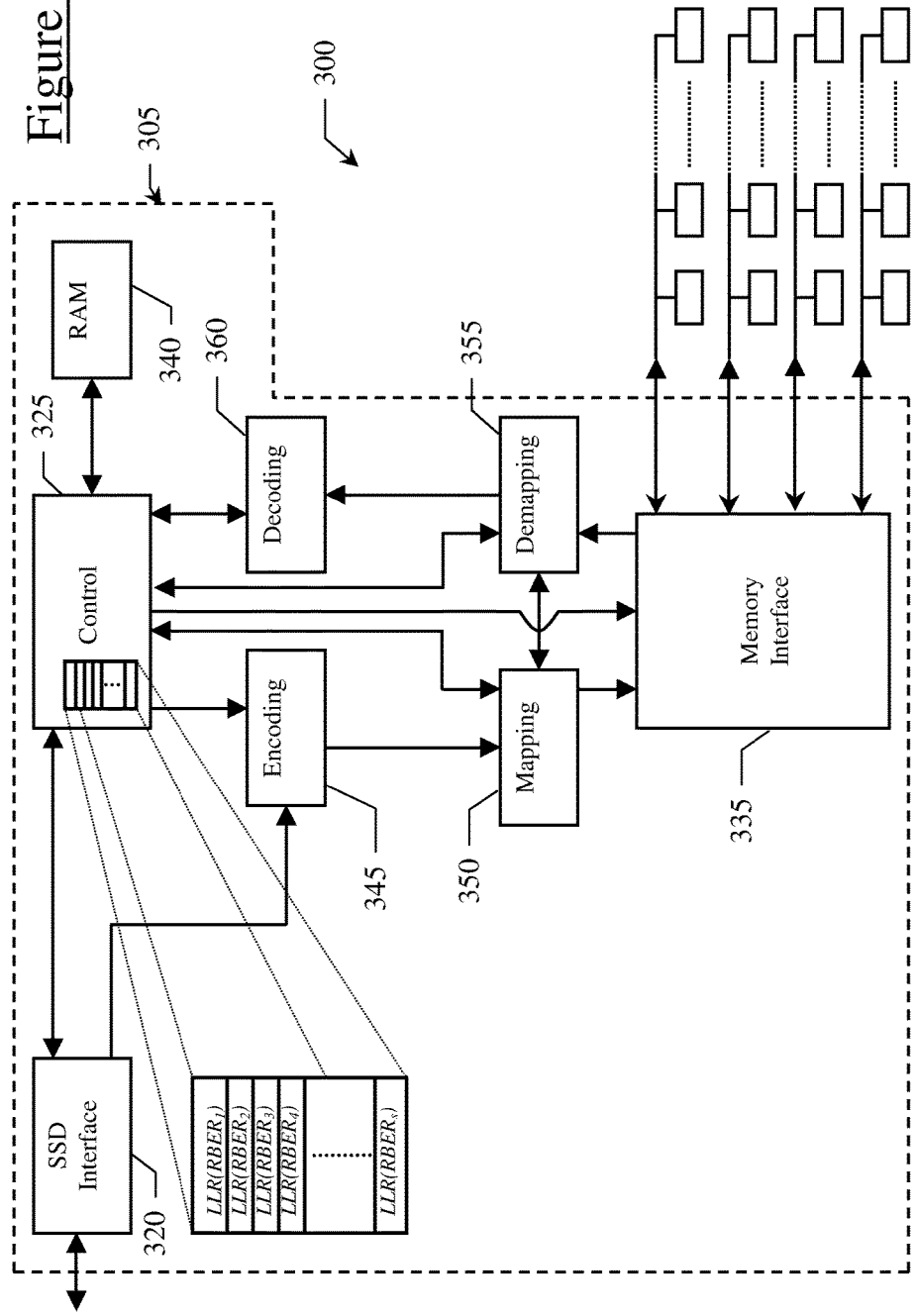

METHOD FOR DECODING BITS-BY VARYING LLR VALUES IN A SOLID-STATE DRIVE, AND SOLID-STATE DRIVE IMPLEMENTING THE METHOD

BACKGROUND OF THE INVENTION

Field of the Invention

The present invention generally relates to "Solid State Drives" (hereinafter, SSD devices), such as SSD devices provided with non-volatile memory chips (e.g., NAND flash memory chips) for storing data. More particularly, the present invention relates to SSD devices provided with error correction capabilities. Even more particularly, the present invention relates to a method for decoding bits in such SSD devices, and to SSD devices (or controllers thereof) implementing the method.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

Each memory cell comprises a floating gate transistor. Each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols), practically each threshold voltage associated with a corresponding logical state (or, equivalently, with a corresponding symbol) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a 2-bit MLC memory cell (hereinafter referred to as MLC memory cell for the sake of conciseness) and in the top drawing of FIG. 2C for a TCL memory cell. In such figures the threshold voltage distributions are denoted by $D_j$ (j ranging from 1 to 4 for the MLC memory cell and from 1 to 8 for the TLC memory cell).

As visible in these drawings, the threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1, 2, 3 in the example of FIG. 2B and k=1, 2, 3, 4, 5, 6, 7 in the example of FIG. 2C).

In case of the MLC memory cell, during a read operation a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In case of the TLC memory cell, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell, the threshold voltage of the memory cell is compared to the hard reference voltages $V_k$. Typically, reading a memory cell that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention, which translates into partially overlapping areas of adjacent threshold voltage distributions $D_j$ (shown in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions $D_j$, and particularly according to the overlapping areas of the adjacent threshold voltage distributions $D_j$.

As a result of the advances in memory cell technology, the RBER for selected memory cells is increasingly nearing the Shannon limit of the communication channel. The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read (hard and soft) bit typically evaluated according to RBER—the decoding based on the hard and soft bits being referred to as hard and soft decoding, respectively.

In the known solutions, the soft bits mainly arise from multiple read operations. Indeed, according to a common approach, when a read operation takes place on the selected memory cells, and the number of bit errors is found to be higher than correction capabilities of the "Forward Error Correction", the flash memory device (e.g., the SSD controller thereof) is typically configured to reread the selected memory cells at different values of the reference voltages to attempt to establish the bits in those areas of the threshold voltage distributions $D_j$ wherein bit error is most likely. Such multiple readings are typically carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$ (in the following the overall reference voltages including both the hard reference voltages $V_k$ and the associated soft reference voltages $V_{kA}$-$V_{kF}$ will be also denoted, as a whole, by reference voltages $V_{kA}$, $V_{kA}$-$V_{kF}$ for the sake of conciseness).

SUMMARY OF THE INVENTION

The Applicant has recognized that nowadays SSD devices, especially those currently most widespread (i.e., the SSD devices based on MLC and TLC technologies, hereinafter referred to as MLC and TLC SSD devices) are not satisfactory.

According to the Applicant, this is substantially due to the fact that the RBER increases exponentially with program/erase cycles, with the error correction capability that instead increases sub-linearly with ECC code strength. This translates into relatively frequent occurrence of soft decoding failures (i.e. failures to decode the read bits with an acceptable UBER).

In most of known solutions, in response to a failure of the soft decoding—e.g., because of unreliable soft bits (due, for example, to RBER underestimate/overestimate) or because of a trapping set (error floor)—the number of soft reference voltages $V_{kA}$-$V_{kF}$ (and hence of read operations of the selected memory cells) is increased.

However, the Applicant has understood that increasing the number of soft reference voltages $V_{kA}$-$V_{kF}$ could result in very expensive read access times (and, hence, in latency overhead), and that the corresponding increased number of soft bits could result in excessive area overhead. These issues are exacerbated in nowadays SSD devices, which are smaller and smaller and whose bits per memory cell are increasingly growing, as the narrow distance between the threshold voltage distributions $D_j$ requires more and more soft bits to allow correct soft decoding. For example, a typical (2-bit) MLC SSD device may need 21 references voltages $V_{kA}$, $V_{kA}$-$V_{kF}$ (as illustrated in the bottom drawing of FIG. 2B) or more thereof (depending on the desired resolution) for both hard and soft decoding (as compared to 3 hard reference voltages $V_k$ needed for only hard decoding), whereas a typical TLC SSD device may need 49 references voltages $V_{kA}$, $V_{kA}$-$V_{kF}$ (as illustrated in the bottom drawing of FIG. 2C) or more thereof (depending on the desired resolution) for both hard and soft decoding (as compared to the 7 hard reference voltages $V_k$ needed for only hard decoding).

The Applicant is aware of the existence of some solutions wherein, in response to a failure of the soft decoding, the soft reference voltages $V_{kA}$-$V_{kF}$ are modified (e.g., optimized according to RBER analysis) and multiple read operations are carried out with respect to these modified soft reference voltages $V_{kA}$-$V_{kF}$. However, the Applicant has ascertained that these solutions, although providing substantially no area overhead, are still affected by latency overhead.

The Applicant has tackled the above-discussed issues, and has devised a method for improving soft decoding with no area nor latency overheads.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for decoding read bits including information bits from memory cells of a solid state drive. The method comprises providing an indication of reliability of the read bits, and, based on said indication of reliability, iteratively soft decoding the read bits in order to obtain said information bits. Said soft decoding comprises, at each iteration of the soft decoding:
  if the current number of iterations has reached a predetermined number of iterations indicative of an admitted latency of the solid state drive, and if no information bits having an error rate below a predetermined error rate have been obtained:
    providing a further indication of reliability of the read bits, and
    iteratively soft decoding the read bits based on said further indication of reliability.

According to an embodiment of the present invention, each memory cell comprises a floating gate transistor adapted to store a bit pattern, among a plurality of possible bit patterns, when programmed at a threshold voltage associated with that bit pattern, each threshold voltage being preferably variable over the memory cells thereby defining a corresponding threshold voltage distribution. Advantageously, said indication of reliability depends on a "Raw Bit Error Rate" estimate indicative of overlapping areas between adjacent threshold voltage distributions. More advantageously, said providing a further indication of reliability comprises providing a further "Raw Bit Error Rate" estimate, said further indication of reliability preferably depending on said further "Raw Bit Error Rate" estimate.

According to an embodiment of the present invention, said further "Raw Bit Error Rate" estimate is based on at least one among the following solid state drive parameters:
   program/erase cycles;
   retention;
   inter-cell interference;
   temperature.

According to an embodiment of the present invention, said providing a further indication of reliability comprises superimposing a noise component to said indication of reliability.

According to an embodiment of the present invention, said noise component comprises a white noise component.

According to an embodiment of the present invention, said superimposing a noise component to said indication of reliability is carried out if the soft decoding is affected by "Error Floor".

According to an embodiment of the present invention, the method is carried out after a read operation of the solid state drive, the read operation providing said read bits. Preferably, said providing an indication of reliability further comprises storing the indication of reliability, so that, after a number of read operations of the solid state drive, a plurality of indications of reliability each one of respective read bits are stored. More preferably, said providing a further indication of reliability comprising, for the read bits to be decoded:
   selecting, among said plurality of indications of reliability, an indication of reliability of read bits different from the read bits to be decoded.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, each indication of reliability depends on a respective "Raw Bit Error Rate" estimate indicative of overlapping areas between adjacent threshold voltage distributions.

According to an embodiment of the present invention, said selecting is carried out if the soft decoding is affected by "Error Floor".

According to an embodiment of the present invention, said soft decoding is based on a "Low Density Parity Check" (LDPC) code.

Another aspect of the present invention relates to a controller for a solid state drive. The controller comprises:
   a decoding unit for decoding read bits including information bits from memory cells of the solid state drive,
   a soft decoding unit for iteratively soft decoding the read bits in order to obtain said information bits, said soft decoding being based on an indication of reliability of the read bits, and
   a control unit for providing said indication of reliability and for checking a current number of soft decoding iterations and an error rate of the information bits from the soft decoding unit.

At each soft decoding iteration, if the current number of soft decoding iterations has reached a predetermined number of soft decoding iterations indicative of an admitted latency of the solid state drive and if no information bits having an error rate below a predetermined error rate have been obtained, the control unit is arranged for providing a further indication of reliability of the read bits and the soft decoding unit is arranged for iteratively soft decoding the read bits based on said further indication of reliability.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, said indication of reliability depends on a "Raw Bit Error Rate" estimate indicative of overlapping areas between adjacent threshold voltage distributions. Even more preferably, said control unit is arranged for providing a further "Raw Bit Error Rate" estimate, said further indication of reliability depending on said further "Raw Bit Error Rate" estimate.

According to an embodiment of the present invention, said further "Raw Bit Error Rate" estimate is based on at least one among the following solid state drive parameters:
   program/erase cycles;
   retention;
   inter-cell interference;
   temperature.

According to an embodiment of the present invention, said further indication of reliability comprises said indication of reliability and a noise component superimposed thereto.

According to an embodiment of the present invention, said noise component comprises a white noise component.

According to an embodiment of the present invention, the control unit is arranged for providing said further indication of reliability by superimposing a noise component to said indication of reliability if the soft decoding is affected by "Error Floor".

According to an embodiment of the present invention, said read bits result from a respective read operation of the solid state drive. Preferably, the control unit is further arranged for storing the indication of reliability of the read bits, so that, after a number of read operations of the solid state drive, a plurality of indications of reliability each one of respective read bits are stored. More preferably, the control unit is further arranged for providing the further indication of reliability by selecting, among said plurality of indications of reliability, an indication of reliability of read bits different from the read bits to be decoded.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, each indication of reliability depends on a respective "Raw Bit Error Rate" estimate indicative of overlapping areas between adjacent threshold voltage distributions.

According to an embodiment of the present invention, the control unit is arranged for providing the further indication of reliability by selecting, among said plurality of indications of reliability, an indication of reliability of read bits different from the read bits to be decoded if the soft decoding is affected by "Error Floor".

According to an embodiment of the present invention, said soft decoding unit is based on a "Low Density Parity Check" (LDPC) code.

A further aspect of the present invention relates to a solid state drive comprising:
  memory cells,
  a decoding unit for decoding read bits including information bits from the memory cells,
  a soft decoding unit for iteratively soft decoding the read bits in order to obtain said information bits, said soft decoding being based on an indication of reliability of the read bits,
  a control unit for providing said indication of reliability and for checking a current number of soft decoding iterations and an error rate of the information bits from the soft decoding unit,
wherein, at each soft decoding iteration, if the current number of soft decoding iterations has reached a predetermined number of soft decoding iterations indicative of an admitted latency of the solid state drive and if no information bits having an error rate below a predetermined error rate have been obtained, the control unit is arranged for providing a further indication of reliability of the read bits and the soft decoding unit is arranged for iteratively soft decoding the read bits based on said further indication of reliability.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, said indication of reliability depends on a "Raw Bit Error Rate" estimate indicative of overlapping areas between adjacent threshold voltage distributions. More preferably, said control unit is arranged for providing a further "Raw Bit Error Rate" estimate, said further indication of reliability depending on said further "Raw Bit Error Rate" estimate.

According to an embodiment of the present invention, said further "Raw Bit Error Rate" estimate is based on at least one among the following solid state drive parameters:
  program/erase cycles;
  retention;
  inter-cell interference;
  temperature.

According to an embodiment of the present invention, said further indication of reliability comprises said indication of reliability and a noise component superimposed thereto.

According to an embodiment of the present invention, said noise component comprises a white noise component.

According to an embodiment of the present invention, the control unit is arranged for providing said further indication of reliability by superimposing a noise component to said indication of reliability if the soft decoding is affected by "Error Floor".

According to an embodiment of the present invention, said read bits result from a respective read operation of the solid state drive. Preferably, the control unit is further arranged for storing the indication of reliability of the read bits, so that, after a number of read operations of the solid state drive, a plurality of indications of reliability each one of respective read bits are stored. More preferably, the control unit is further arranged for providing the further indication of reliability by selecting, among said plurality of indications of reliability, an indication of reliability of read bits different from the read bits to be decoded.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, each indication of reliability depends on a respective "Raw Bit Error Rate" estimate indicative of overlapping areas between adjacent threshold voltage distributions.

According to an embodiment of the present invention, the control unit is arranged for providing the further indication of reliability by selecting, among said plurality of indications of reliability, an indication of reliability of read bits different from the read bits to be decoded if the soft decoding is affected by "Error Floor".

According to an embodiment of the present invention, said soft decoding unit is based on a "Low Density Parity Check" (LDPC) code.

According to an embodiment of the present invention, the memory cells are flash memory cells.

According to an embodiment of the present invention, said memory cells are NAND flash memory cells.

BRIEF DESCRIPTION OF THE ANNEXED DRAWINGS

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the present invention;

DETAILED DESCRIPTION OF PREFERRED EMBODIMENTS OF THE INVENTION

Figure 1A:
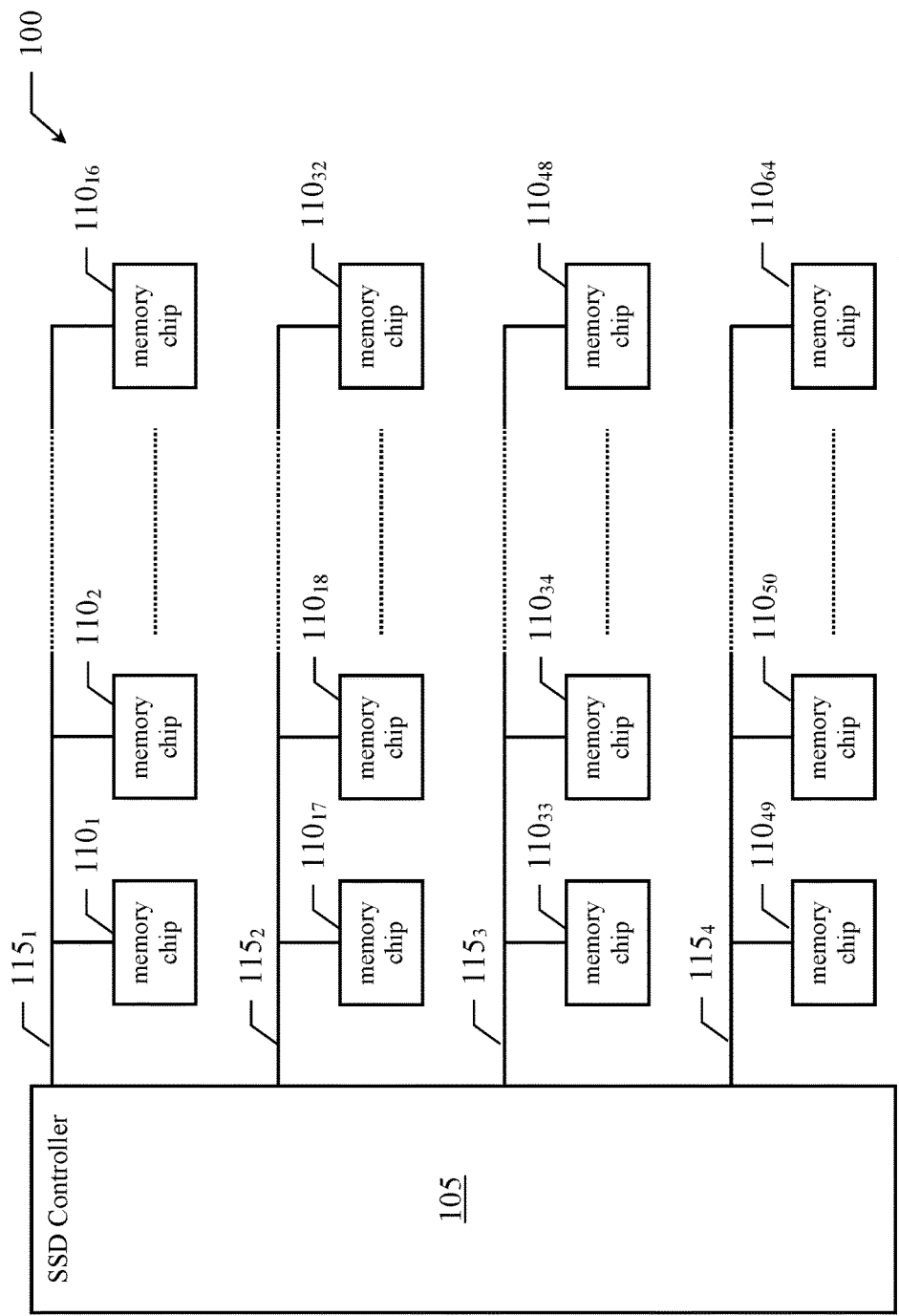

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, ..., I, with I=64 in the example at issue), and a plurality of (e.g., synchronous and/or asynchronous) channels $115_j$ (j=1, 2, 3, ..., J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

Figure 1B:
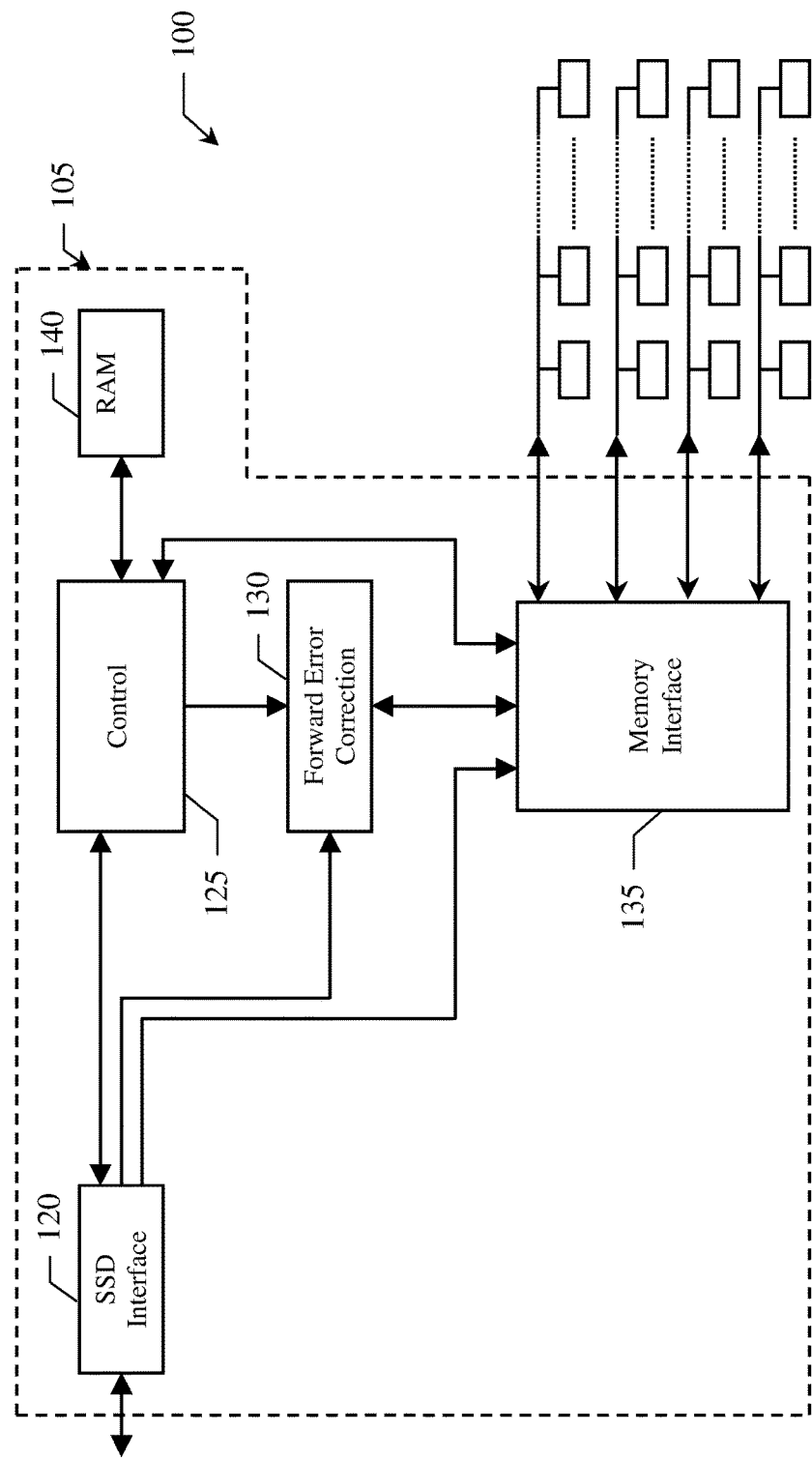

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_i$ and the channels $115_j$ (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_i$ along the channels $115_j$ and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ can be provided, or a memory interface unit 135 for each memory chip $110_i$, or for each group of memory chips $110_i$ can be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

Figure 2A:
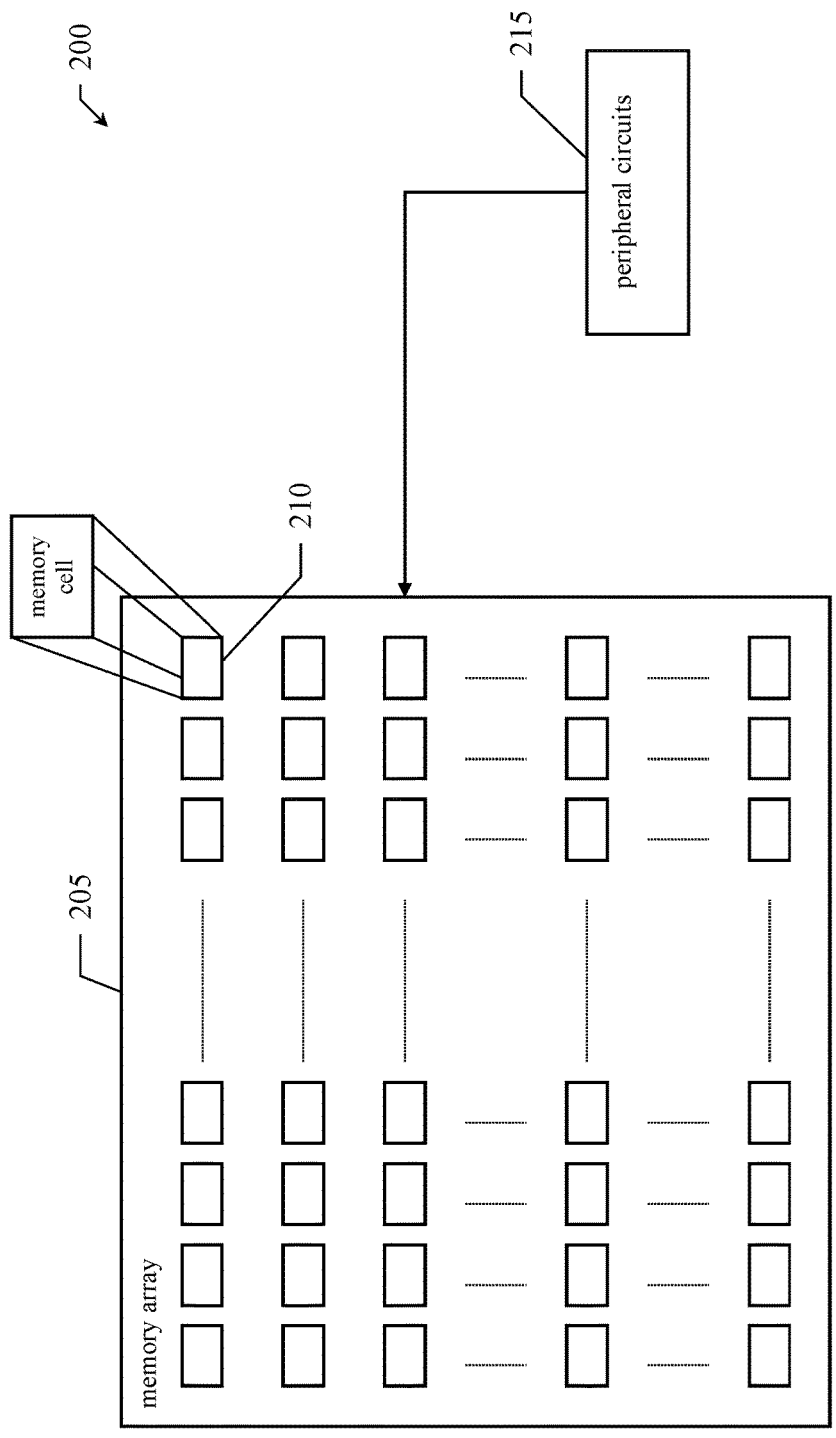

A typical flash memory die, illustrated in FIG. 2A and denoted by the number reference 200, comprises one (as depicted) or more memory arrays 205 of memory cells (e.g., NAND flash memory cells) 210 arranged in rows and columns.

Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol comprising one bit (i.e. two logical states, 0 or 1, defining, i.e. being associated with, two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining, i.e. being associated with, eight threshold voltages). In the following, explicit reference will be made to SSD devices having MLC or TLC memory cells (referred to as MLC and TLC SSD devices, respectively), which the present invention is mainly (but not exclusively) intended to.

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take. This is schematically shown in the top drawing of FIG. 2B for a MLC memory cell and in the top drawing of FIG. 2C for a TCL memory cell.

Figure 2B:
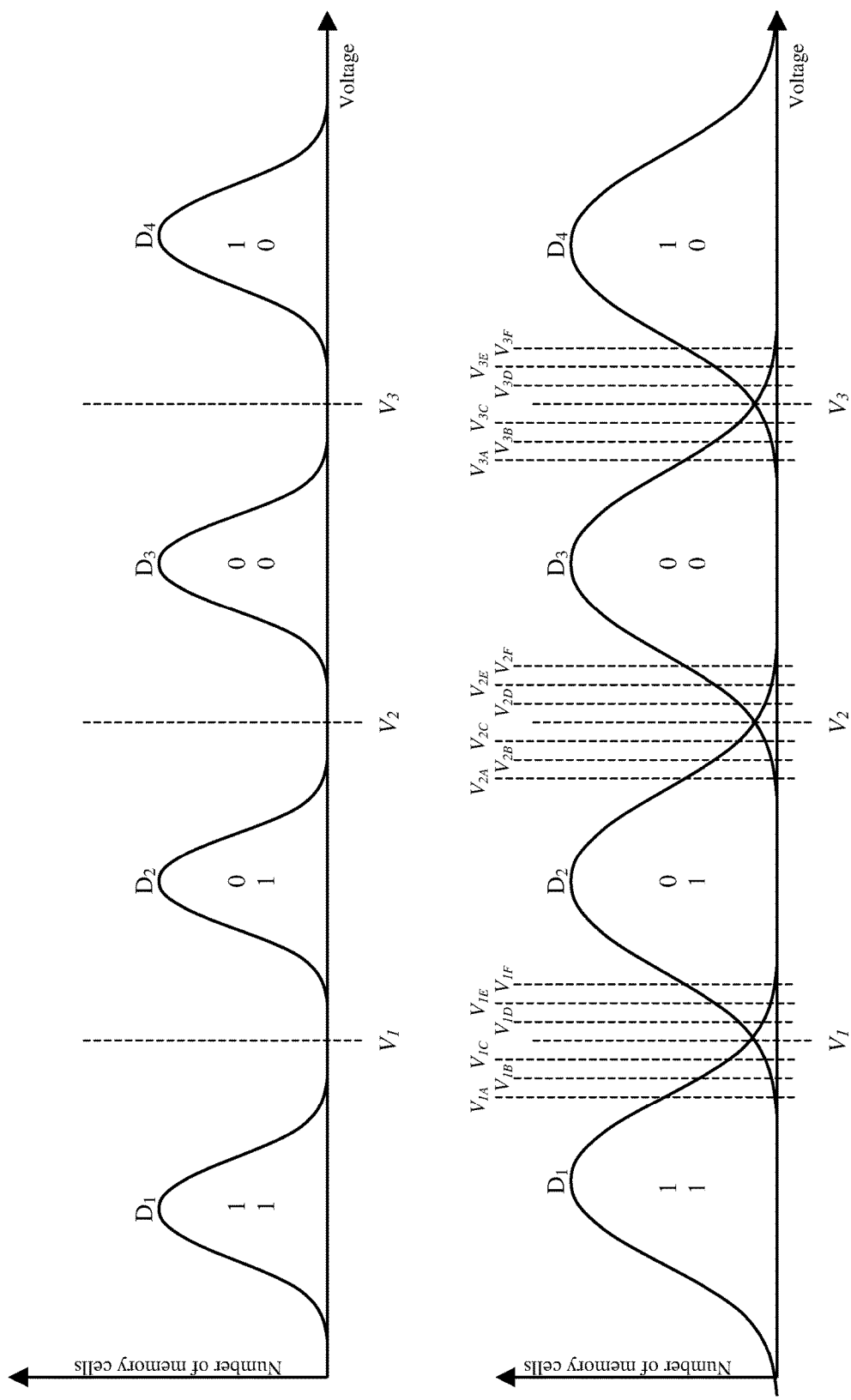
Figure 2C:
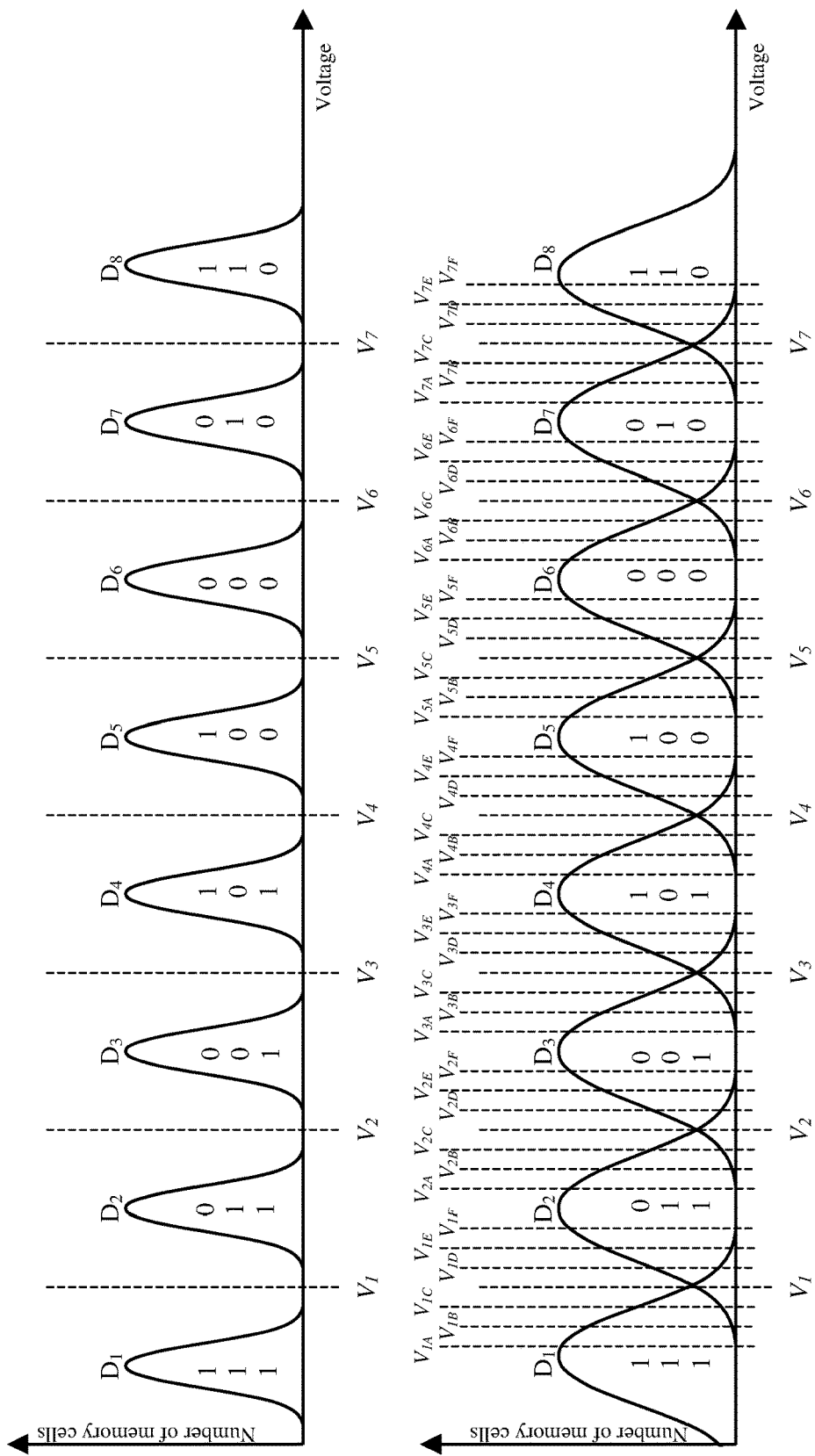

As discussed in the introductory part of this description, the threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C).

In the case of MLC memory cell, during a read operation, a threshold voltage below the hard reference voltage $V_1$ represents the bit pattern "11", a threshold voltage between the hard reference voltages $V_1$ and $V_2$ represents the bit pattern "01", a threshold voltage between the hard reference voltages $V_2$ and $V_3$ represents the bit pattern "00", and a threshold voltage above the hard reference voltage $V_3$ represents the bit pattern "10". In the case of TLC memory cell, during a read operation, a threshold voltage below the hard reference voltage $V_1$ represents the bit pattern "111", a threshold voltage between the hard reference voltages $V_1$ and $V_2$ represents the bit pattern "011", a threshold voltage between the hard reference voltages $V_2$ and $V_3$ represents the bit pattern "001", a threshold voltage between the hard reference voltages $V_3$ and $V_4$ represents the bit pattern "101", a threshold voltage between the hard reference voltages $V_4$ and $V_5$ represents the bit pattern "100", a threshold voltage between the hard reference voltages $V_5$ and $V_6$ represents the bit pattern "000", a threshold voltage between the hard reference voltages $V_6$ and $V_7$ represents the bit pattern "010", and a threshold voltage above the hard reference voltage $V_7$ represents the bit pattern "110".

To read a memory cell 210, the threshold voltage of the memory cell 210 is compared to the hard reference voltages $V_k$. According to an embodiment, reading a memory cell 210 that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution $D_j$, the LSB and MSB bits are assumed to be the bottom and top bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution $D_j$, the LSB, CSB and MSB bits are assumed to be the bottom, central and top bits, respectively. The terms LSB, CSB and MSB are used only as a reference to specific bits within the memory cell, and do not imply that certain bits are more important than others (in this respect, any other suitable terminology can also be used).

According to a typical implementation, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps of a method according to the present invention.

As visible in the figure, the SSD controller 305 comprises, similarly to the SSD controller 105, a SSD interface 320, a control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value by means hard bits (i.e., the read bits resulting from comparisons to the hard reference voltages $V_k$) and of additional information including soft bits and an indication of the reliability of each read (hard and soft) bit typically evaluated or estimated according to RBER—the decoding based on the hard and soft bits being referred to as hard and soft decoding, respectively. More preferably, the ECC code is a "Low-Density Parity-Check" (LDPC) code—hence, the encoding unit 345 will be referred to as LDPC encoding unit 345 and the corresponding encoded bits will be referred to as LDPC encoded bits. LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit, the total number of bits created by the encoding unit including the parity bits), LDPC code approaches the Shannon limit more than ECC codes typically used in prior art solutions (such as Bose-Chaudhuri-Hocquenghem (BCH) codes), which translates into area saving while maximizing the probability of accurately recovering the bits after a read operation.

Figure 3B:
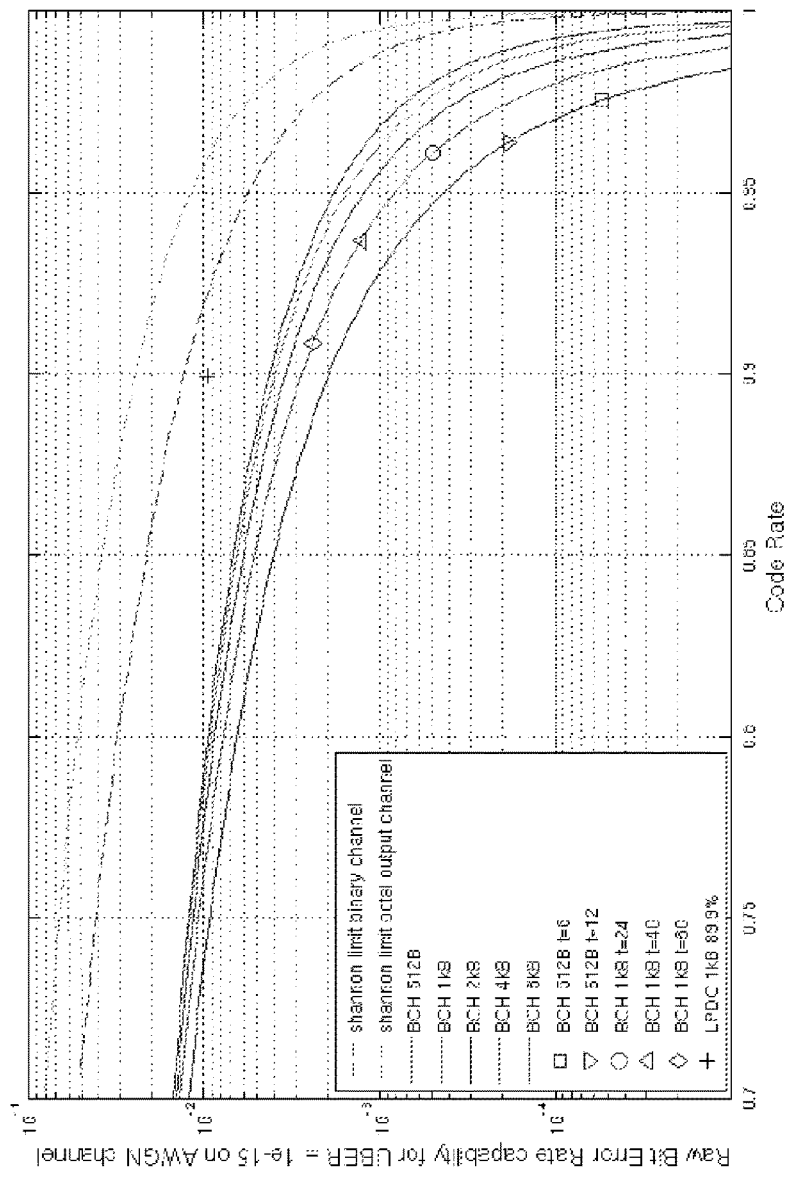
FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A.

This is illustrated in FIG. 3B, which shows a diagram of "Raw Bit Error Rate", with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit 350 for "mapping" the LPDC encoded bits into mapped LDPC encoded bits (the mapped LDPC encoded bits representing the symbols to be written/programmed), thereafter the symbols can be stored in the memory chips $110_i$ (e.g., similarly to the above, by means of the memory interface unit 335 that transmits the symbols to the memory chips $110_i$, and thanks to control unit 325 action that controls addressing of the memory chips $110_i$ to be written/programmed). Preferably, as also conceptually illustrated by arrow connections between the SSD control unit 325, the encoding unit 345, the mapping unit 350, and the memory interface unit 335, the mapping unit 350 (and, hence, the mapping operation performed by it) can be selectively enabled by the control unit 325, and hence the LDPC encoded bits may be fed directly to the memory interface unit 335 when the mapping unit 350 is disabled. According to an embodiment of the present invention, selective enabling of the mapping unit 350 takes place after a predetermined number of detected failures (e.g., bit errors). Additionally or alternatively, selective enabling of the mapping unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

The SSD controller 305 further comprises demapping 355 and LDPC decoding 360 units for carrying out demapping and decoding operations to the read symbols in order to extract the information bits therefrom (the demapping and LDPC decoding operations being substantially reverse operations with respect to the encoding and mapping operations carried out at LDPC encoding 345 and mapping 350 units, respectively).

The mapping 350 and demapping 355 units are not limiting for the present invention. By way of example only, the mapping 350 and demapping 355 units may be implemented as disclosed in the U.S. patent application Ser. No. 14/789,513, and/or in the in the U.S. patent application Ser. No. 14/789,513, and/or in the U.S. patent application Ser. No. 14/789,513, and/or in the U.S. patent application Ser. No. 14/789,522, whose disclosures are herein incorporated by reference.

As mentioned above, the LDPC decoding unit 360 is configured to perform a soft decoding of the read bits, i.e. it allows determining each bit values by means of the hard bits and of higher order (additional) information (preferably obtained from the memory cells during the error correction process) including soft bits and an indication of the reliability of each read (hard and soft) bit.

Preferably, the indication of the reliability of each read (hard and soft) bit is in the form of a "Log Likelihood Ratio" value (LLR, hereinafter, LLR value) associated with that bit (i.e., a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability. Thus, a bit with an LLR value equal to 63 is more likely to be a 0 than a bit with an LLR value equal to 5, and a bit with an LLR value equal to −63 is more likely to be a 1 than a bit with an LLR value equal to −5. An LLR value equal to 0 may instead indicate that the bit is equally likely to be a 0 or a 1. By way of example only, for a given RBER, the LLR values for a set of four read bits may be [50, 5, −5, −50].

The LLR values depend on RBER, whose estimate in turns depends on the shape, and particularly on the overlap areas, of the threshold voltage distributions $D_j$—in the art, a number of techniques for estimating the RBER exist, which are typically developed autonomously by the manufacturers for their specific design needs and convenience. Thus, each RBER (estimate) is associated with respective LLR values. According to an embodiment of the present invention, these LLR values are arranged in a table (hereinafter, LLR table), preferably stored in the control unit 325 of the SSD controller 305 (as schematically illustrated in the enlarged detail in the figure) and accessed by the LDPC decoding unit 360 when required. Preferably, the LLR table is structured such that each row of the LLR table comprises the LLR values associated with a respective RBER (estimate)—conceptually denoted in the figure by the wording LLR(RBER$_s$), with s=1, 2, 3, . . . , S. The number S of stored rows of LLR values is preferably chosen according to specific design options: by way of example only, each row of LLR values comprises the LLR values referring to a RBER (estimate) estimated in association with one or more previous read operations carried out by the SSD device 300—in other words, according to this example, after a number of read operations of the SSD device 300, a plurality of rows of LLR values are stored in the control unit 325, each row of LLR values being associated with respective read bits (i.e., of the read bits resulting from respective read operations), and hence with respective RBER (estimates). The provision of the LLR table is optional, and is particularly advantageous in an embodiment of the present invention, discussed in the following, providing the soft decoding of the read bits based on LLR values associated with different read bits (i.e., by "pointing" to a row of the LLR table different from the row actually containing the LLR values of the read bits to be decoded).

The soft bits mainly arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$—the read operations at the soft reference voltages $V_{kA}$-$V_{kF}$ provide the soft bits, and are typically denoted as soft read operations (as opposed to the read operations at the hard reference voltages $V_k$ providing the hard bits, which are typically denoted by hard read operations). In other words, soft bits (and the associated LLR values) provide additional information that can be used by the LDPC decoding unit 360 to speed up and/or to quickly converge. By way of example only, the soft reference voltages $V_{kA}$-$V_{kC}$ may be obtained by progressively decreasing the hard reference voltage $V_k$ by a 0.5V step, whereas the soft reference voltages $V_{kA}$-$V_{kF}$ may be obtained by progressively increasing the hard reference voltage $V_k$ by a 0.5V step.

In the following, for the sake of conciseness, the overall reference voltages including both the hard reference voltages $V_k$ and the associated soft reference voltages $V_{kA}$-$V_{kF}$ will be also denoted, as a whole, by reference voltages $V_{kA}$, $V_{kA}$-$V_{kF}$.

As the RBER increases exponentially with program/erase cycles, while the error correction capability instead increases sub-linearly with ECC code strength, relatively frequent occurrence of soft decoding failures may take place.

A typical soft decoding failure comprises the failure to complete the decoding process within a prescribed time limit indicative of an admitted latency of the SSD device 300. This, in turn, could be due to a weakness which iterated sparse graph-based ECC codes (such as most LDPC codes) suffer, and known as error floor, wherein the RBER observed after application of the LDPC code (and referred to as "Frame Bit Error Rate" (FER)), decreases more slowly or flattens out with an increase in "Signal to Noise Ratio" (SNR).

Figure 3C:
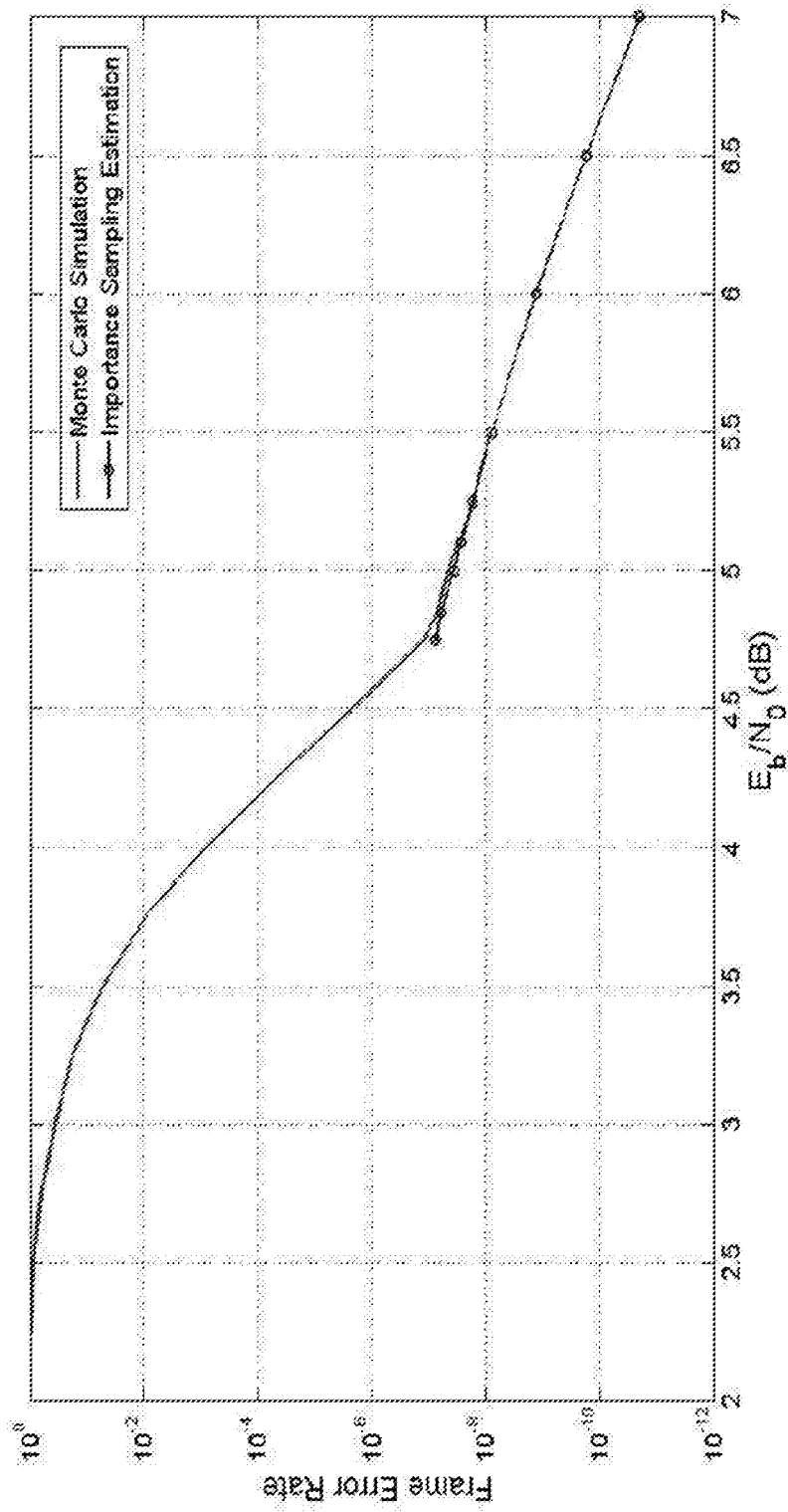
FIG. 3C shows a diagram of "Frame Error Rate" with respect to "Signal to Noise Ratio" illustrating a typical "Low Density Parity Check" code affected by error floor.

As visible in FIG. 3C, which shows a diagram of the FER (in the ordinate axis) with respect to SNR (in the abscissa axis) illustrating a typical LDPC code affected by error floor, the FER as a function of SNR typically comprises two distinct regions: an initial "waterfall" region where the FER improves (decreases) rapidly given a unit increase in SNR, and a subsequent "error-floor" region where increases in SNR yields only modest improvements in FER.

Error-floors are mainly attributed to a particular combinatorial structure in the codes' Tanner graphs known as trapping sets, which prevent decoding from converging to the correct sequence of bits (or codeword). Indeed, when the LDPC decoding unit fails to converge on the correct codeword within a specified maximum number of iterations, it generates a failed codeword. Failed codewords are typically classified by the number of "Unsatisfied Check Nodes" (USC nodes) they contain—i.e. failed parity-check constraints in the LDPC decoding algorithm. Among them, a near codeword is a failed codeword that features a small number of USC nodes (e.g., 16 or fewer for an approximately 5,000-bit codeword). Sometimes, the USC nodes in a near codeword form a stable configuration, known as a trapping set, for which further decoding iterations will not produce the correct codeword.

Another typical soft decoding failure comprises the failure to decode the read bits with an acceptable UBER. This, in turn, could be due to RBER underestimate/overestimate, and, hence, to respective inaccurate LLR values. This kind of soft decoding failure typically generates a failed codeword with a large number of USC nodes (e.g., greater than 16 for an approximately 5,000-bit codeword).

Figure 4:
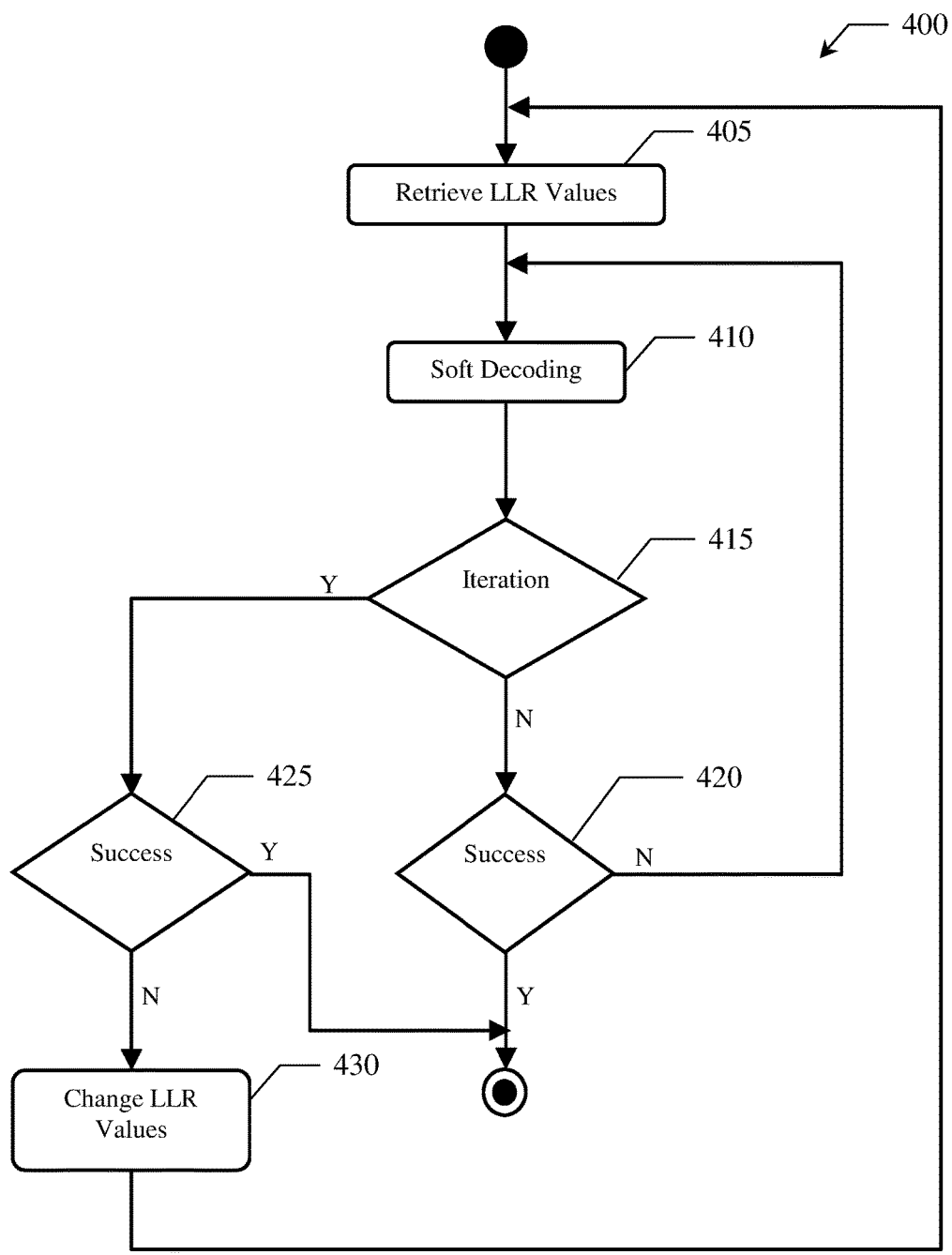
FIG. 4 schematically shown an activity diagram of a soft decoding procedure carried out by the SSD controller of FIG. 3A according to an embodiment of the present invention.

With reference now to FIG. 4, it schematically shows, according to an embodiment of the present invention, an activity diagram of a soft decoding procedure 400 carried out by the SSD controller 300 after reading (hard and soft) bits from the selected memory cells.

The soft decoding procedure 400 starts by determining an indication of the reliability of the read bits (action node 405)—e.g. by retrieving the LLR values (associated with the read bits) in the LLR table, that, for the current RBER estimate, is stored in the SSD controller 305 (for example, in the control unit 325 thereof)—thereafter (action node 410) iterative soft decoding of the read bits based on the LLR values takes place as usual.

Broadly speaking, according to the principles of the present invention, if a current number of iterations of the soft decoding has exceeded a predetermined number of iterations indicative of an admitted latency of the solid state drive 300, and if the soft decoding of said read bits has not ended, further LLR values for the read bits are determined, and iterative soft decoding of the read bits takes place based on said further LLR values of the read bits (this summarizes the nodes 415-430, discussed below, of the soft decoding procedure 400).

In the known solutions, in response to a failure of the soft decoding, the following approaches are mainly followed:
the number of soft reference voltages $V_{kA}$-$V_{kF}$ (and hence of read operations of the selected memory cells) is increased. However, increasing the number of soft reference voltages $V_{kA}$-$V_{kF}$ results in very expensive read access times (and, hence, in latency overhead), and the corresponding increased number of soft bits could result in excessive area overhead; or
the soft reference voltages $V_{kA}$-$V_{kF}$ are modified (e.g., optimized according to RBER analysis) and multiple (additional) read operations are carried out with respect to these modified soft reference voltages $V_{kA}$-$V_{kF}$. However, this approach, although providing substantially no area overhead, is still affected by latency overhead.

In sharp contrast thereto, the present invention instead provides for modifying the LLR values for the read bits so as to require no further read operations, and no additional soft bits to be processed.

Back to the activity diagram, periodically (e.g., after each iteration of the soft decoding carried out at the action node 410), a check is performed (decision node 415) aimed at evaluating whether the current number of iterations (i.e. the number of iterations so far performed for the read bits/codeword under processing) has reached, i.e. it is equal to, a predetermined number of iterations indicative of an admitted latency of the solid state drive 300.

If the current number of iterations has not reached said predetermined number of iterations (exit branch N of the decision node 415), it meaning that the current number of iterations is still lower than the predetermined number of iterations, another check is performed at the decision node 420 aimed at determining whether the soft decoding of the read bits has ended and a valid codeword is output. In the negative case (exit branch N of the decision node 420), the soft decoding procedure 400 goes back to action node 410, where the soft decoding of the read bits continues as before with the same current LLR values. If instead the soft decoding of said read bits has ended (exit branch Y of the decision node 420), so that a validly decoded codeword is output without latency overhead, the soft decoding procedure 400 ends (see double circle in the figure).

Back to the decision node 415, if the current number of iterations has reached the predetermined number of iterations (exit branch Y of the decision node 415), it meaning that the current iteration is the last soft decoding iteration that is allowed to be performed in order to still meet the prescribed latency overhead constraint, another check is performed at the decision node 425 aimed at determining (similarly to decision node 420) whether the soft decoding of the read bits has correctly ended. In the affirmative case (exit branch Y of the decision node 425), it meaning that the available soft decoding iterations have been sufficient to output a valid codeword, the soft decoding procedure 400 ends, otherwise (exit branch N of the decision node 425) the further LLR values for the read bits are determined (action node 430) and the soft decoding of the read bits based on the further LLR values is performed (which equals to say that, as conceptually illustrated in the figure by loop connection between the action node 430 and the action node 405, that the soft decoding procedure 400 is repeated as discussed above by applying to the same read bits, which hence do not require rereading, the further LLR values).

In the following, three main embodiments of the present invention for determining the further LLR values will be discussed.

According to a first embodiment of the present invention, the further LLR values are determined according to a further estimate of the RBER (hereinafter, further RBER), the further estimate of the RBER being for example obtained by means of the above-mentioned solutions (in any case, different RBER estimate methods could also be envisaged for the estimate of the RBER and for the further estimates of the RBER; at most, the possibility of using a different RBER estimate method for each estimate of the RBER is not excluded). Determining the further LLR values from a further estimate of the RBER is advantageous especially when invalid codewords arise from LLR values determined from a RBER underestimate or a RBER overestimate.

According to a second embodiment of the present invention (additional or alternative to the first embodiment), the further LLR values are generated by superimposing a noise component to the current LLR values (i.e., the LLR values used until the last soft decoding iteration). This is advantageous especially when invalid codewords arise from soft decoding being trapped in a trapping set (killer loop), so that unbalancing provided by the noise component on the LLR values can help in exiting the killer loops.

Back to the example of above of current LLR values equal to [50, 5, −5, −50], and assuming to superimpose a noise component of [40, −2, −3, 3], the resulting further LLR values would be [40, 3, −8, −47].

Given the close relationship between the RBER estimate and the LLR values, the further LLR values resulting from superimposing the noise component to the current LLR values correspond to a different RBER estimate. However, applying the noise component directly to the LLR values is a quick solution to escape the killer loops (indeed, a further RBER estimate and the following further LLR values therefrom would imply certain processing times and capabilities that could affect the performance of the SSD device 300). Thus, although by the conceptual viewpoint the further LLR values imply a further RBER estimate associated therewith, superimposing the noise component is a preferred way to exit the killer loops without burdening the processing capability of the SSD device 300.

Preferably, the noise component is, or comprises, a white noise component. In the considered scenario of intrinsically-discrete LLR values, the white noise component is herein intended as a discrete signal whose samples are regarded as a sequence of serially uncorrelated random variables with zero mean and finite variance. Depending on the specific implementation, not limiting for the present invention, the samples may be independent from each other and have the same probability distribution (such as a Gaussian white noise, wherein each sample has a normal distribution with zero mean).

Advantageously, the noise component is applied to all the LLR values of the LLR table associated with the current RBER estimate. This is advantageous especially when, after exiting the killer loops, a valid codeword is output and soft decoding of new read bits takes place while keeping the same RBER estimate. In this respect, it could also be provided that the noise component is applied by taking into account previously superimposed noise components. This could be advantageous when the RBER is desired/required to be kept substantially the same over a certain time period, so that as the LLR values changes (which, conceptually, define respective new RBER estimates) substantially (i.e., approximatively) compensate each other over a certain time period.

According to a third embodiment of the present invention (additional or alternative to the first and/or second embodiments discussed above), the further LLR values are provided by selecting, among the stored LLR values, the LLR values belonging to a row of LLR values associated with read bits (and, hence, with a RBER (estimate)) different from the read bits to be decoded (and, hence, different from the actual RBER (estimate) associated with the read bits to be decoded). In other words, in case of failure of the soft decoding, the control unit 325 "points" to a row of the LLR table different from the row actually containing the LLR values of the read bits to be decoded.

This is advantageous for quickly escaping the killer loops (indeed, a further RBER estimate and the following further LLR values therefrom would imply certain processing times and capabilities that could affect the performance of the SSD device 300), the LLR values of a different (and, preferably, uncorrelated) row of LLR values acting, in this case, as unbalancing component. Thus, the soft decoding of the read bits by means of LLR values associated with different read bits (and, hence, with different RBER (estimates)) is conceptually analogous to the application of a noise component to the LLR values actually associated with the read bits to be decoded. In view of that, it should be understood that any useful selection criterion may be used, without departing from the scope of the present invention, for selecting the further LLR values from the LLR table (and allowing to escape the killer loops)—by way of example only, said selection criterion may be based on time intervals between the read operations, and/or on positions of the LLR values in the LLR table.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A method for decoding read bits including information bits from memory cells of a solid-state drive, the method comprising, after a read operation of the solid-state drive providing said read bits:

providing an indication of reliability of the read bits, wherein the indication of reliability further comprises storing the indication of reliability, so that, after a number of read operations of the solid-state drive, a plurality of indications of reliability each one of respective read bits are stored, based on said indication of reliability, iteratively soft decoding the read bits in order to obtain said information bits, wherein said soft decoding comprises, at each current iteration thereof:

if a current number of iterations has reached a predetermined number of iterations indicative of a latency that is admitted for the solid-state drive, and if no information bits resulting from said soft decoding at a current iteration have been obtained that have an error rate below a predetermined error rate:

providing a further indication of reliability of the read bits, the further indication of reliability comprising, for the read bits to be decoded, selecting, among said plurality of indications of reliability, an indication of reliability of read bits different from the read bits to be decoded, and performing said iteratively soft decoding the read bits based on said further indication of reliability.

2. The method of claim 1, wherein:

each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution;

said indication of reliability depends on a Raw Bit Error Rate estimate indicative of overlapping areas between adjacent threshold voltage distributions, and said providing a further indication of reliability comprises providing a further Raw Bit Error Rate estimate, said further indication of reliability depending on said further Raw Bit Error Rate estimate.

3. The method of claim 2, wherein said further Raw Bit Error Rate estimate is based on at least one among the following solid-state drive parameters:
program/erase cycles;
retention;
inter-cell interference;
temperature.

4. The method of claim 1, wherein said providing a further indication of reliability comprises adding a noise component to said indication of reliability.

5. The method of claim 4, wherein said noise component comprises a white noise component.

6. The method of claim 4, wherein said superimposing a noise component to said indication of reliability is carried out if the soft decoding is affected by Error Floor.

7. The method of claim 1, wherein each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution, and wherein each indication of reliability depends on a respective Raw Bit Error Rate estimate indicative of overlapping areas between adjacent threshold voltage distributions.

8. The method of claim 1, wherein said selecting is carried out if the soft decoding is affected by Error Floor.

9. The method of claim 1, wherein said soft decoding is based on a Low Density Parity Check (LDPC) code.

10. Controller for a solid-state drive, the controller comprising:
a decoding unit for decoding read bits including information bits from memory cells of the solid-state drive, wherein said read bits result from a respective read operation of the solid-state drive,
a soft decoding unit for, based on an indication of reliability of the read bits, iteratively soft decoding the read bits in order to obtain said information bits,
a control unit for providing said indication of reliability and for checking a current number of soft decoding iterations and an error rate of the information bits from the soft decoding unit, the control unit being further arranged for storing the indication of reliability of the read bits, so that, after a number of read operations of the solid-state drive, a plurality of indications of reliability each one of respective read bits are stored,
wherein, at each current soft decoding iteration: if the current number of soft decoding iterations has reached a predetermined number of soft decoding iterations indicative of a latency that is admitted for the solid state drive and if no information bits resulting from said soft decoding at the current soft decoding iteration have been obtained that have an error rate below a predetermined error rate, the control unit is arranged for providing a further indication of reliability of the read bits by selecting, among said plurality of indications of reliability, an indication of reliability of read bits different from the read bits to be decoded, and the soft decoding unit is arranged for, based on said further indication of reliability, performing said iteratively soft decoding the read bits.

11. The controller of claim 10, wherein:
each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution;
said indication of reliability depends on a Raw Bit Error Rate estimate indicative of overlapping areas between adjacent threshold voltage distributions, and
said control unit is arranged for providing a further Raw Bit Error Rate estimate, said further indication of reliability depending on said further Raw Bit Error Rate estimate.

12. The controller of claim 11, wherein said further Raw Bit Error Rate estimate is based on at least one among the following solid-state drive parameters:
program/erase cycles;
retention;
inter-cell interference;
temperature.

13. The controller of claim 10, wherein said further indication of reliability comprises said indication of reliability and a noise component added thereto.

14. The controller of claim 13, wherein said noise component comprises a white noise component.

15. The controller of claim 13, wherein the control unit is arranged for providing said further indication of reliability by superimposing a noise component to said indication of reliability if the soft decoding is affected by Error Floor.

16. The controller of claim 10, wherein each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution, and wherein each indication of reliability depends on a respective Raw Bit Error Rate estimate indicative of overlapping areas between adjacent threshold voltage distributions.

17. The controller of claim 10, wherein the control unit is arranged for providing the further indication of reliability by selecting, among said plurality of indications of reliability, an indication of reliability of read bits different from the read bits to be decoded if the soft decoding is affected by Error Floor.

18. The controller of claim 10, wherein said soft decoding unit is based on a Low Density Parity Check (LDPC) code.

19. Solid state drive comprising:
memory cells,
a decoding unit for decoding read bits including information bits from the memory cells, said read bits result from a respective read operation of the solid-state drive,
a soft decoding unit for, based on an indication of reliability of the read bits, iteratively soft decoding the read bits in order to obtain said information bits,
a control unit for providing said indication of reliability and for checking a current number of soft decoding iterations and an error rate of the information bits from the soft decoding unit, the control unit being further arranged for storing the indication of reliability of the read bits, so that, after a number of read operations of the solid-state drive, a plurality of indications of reliability each one of respective read bits are stored,
wherein, at each current soft decoding iteration: if the current number of soft decoding iterations has reached a predetermined number of soft decoding iterations indicative of a latency that is admitted for the solid state drive and if no information bits resulting from said soft decoding at the current soft decoding iteration have been obtained that have an error rate below a predetermined error rate, the control unit is arranged for providing a further indication of reliability of the read bits by selecting, among said plurality of indications of reliability, an indication of reliability of read bits different from the read bits to be decoded, and the soft decoding unit is arranged for, based on said further indication of reliability, performing said iteratively soft decoding the read bits.

20. The solid-state drive of claim 19, wherein:
each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution;
said indication of reliability depends on a Raw Bit Error Rate estimate indicative of overlapping areas between adjacent threshold voltage distributions, and
said control unit is arranged for providing a further Raw Bit Error Rate estimate, said further indication of reliability depending on said further Raw Bit Error Rate estimate.

21. The solid-state drive of claim 20, wherein said further Raw Bit Error Rate estimate is based on at least one among the following solid-state drive parameters:
program/erase cycles;
retention;
inter-cell interference;
temperature.

22. The solid-state drive of claim 19, wherein said further indication of reliability comprises said indication of reliability and a noise component added thereto.

23. The solid-state drive of claim 22, wherein said noise component comprises a white noise component.

24. The solid-state drive of claim 22, wherein the control unit is arranged for providing said further indication of reliability by adding a noise component to said indication of reliability if the soft decoding is affected by Error Floor.

25. The solid state drive of claim 19, wherein each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution, and wherein each indication of reliability depends on a respective Raw Bit Error Rate estimate indicative of overlapping areas between adjacent threshold voltage distributions.

26. The solid-state drive of claim 19, wherein the control unit is arranged for providing the further indication of reliability by selecting, among said plurality of indications of reliability, an indication of reliability of read bits different from the read bits to be decoded if the soft decoding is affected by Error Floor.

27. The solid-state drive of claim 19, wherein said soft decoding unit is based on a Low Density Parity Check (LDPC) code.

28. The solid-state drive according to claim 19, wherein the memory cells are flash memory cells.

29. The solid-state drive according to claim 19, wherein said memory cells are NAND flash memory cells.

30. A method comprising:
performing a read operation of a solid-state drive, the read operation providing read bits to be decoded,
providing an indication of reliability of the read bits to be decoded, wherein said providing an indication of reliability comprises storing the indication of reliability together with a plurality of stored indications of reliability, each stored indication of reliability of said plurality being an indication of reliability of respective additional read bits different from the read bits to be decoded and provided by additional read operations different from said read operation,
based on said indication of reliability, iteratively soft decoding the read bits to be decoded in order to obtain information bits from the read bits to be decoded, wherein said soft decoding comprises, at each current iteration thereof:
if a current number of iterations has reached a predetermined number of iterations indicative of a latency that is admitted for the solid-state drive, and if no information bits resulting from said soft decoding at the current iteration have been obtained that have an error rate below a predetermined error rate:
providing a further indication of reliability of the read bits to be decoded, wherein said providing a further indication of reliability comprises, for the read bits to be decoded, selecting, among said plurality of stored indications of reliability, an indication of reliability of the additional read bits, and
performing said iteratively soft decoding the read bits based on said further indication of reliability.

* * * * *